(12) United States Patent
Pan et al.

(10) Patent No.: US 9,606,173 B2
(45) Date of Patent: Mar. 28, 2017

(54) IN-CHIP STATIC-CURRENT DEVICE FAILURE DETECTING METHODS AND APPARATUS

(71) Applicants: Semiconductor Manufacturing International (Beijing) Corporation, Beijing (CN); Semiconductor Manufacturing International (Shanghai) Corporation, Shanghai (CN)

(72) Inventors: Jianfeng Pan, Shanghai (CN); Lilung Lai, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (Shanghai) CORPORATION, Shanghai (CN)

(*) Notice: Subject to any disclaimer, the term of this patent is extended or adjusted under 35 U.S.C. 154(b) by 181 days.

(21) Appl. No.: 14/645,860

(22) Filed: Mar. 12, 2015

(65) Prior Publication Data

US 2015/0316601 A1 Nov. 5, 2015

(30) Foreign Application Priority Data

Apr. 30, 2014 (CN) .......................... 2014 1 0182150

(51) Int. Cl.
G01R 31/08 (2006.01)
G01R 31/303 (2006.01)
G01R 31/28 (2006.01)

(52) U.S. Cl.
CPC ........... *G01R 31/303* (2013.01); *G01R 31/08* (2013.01); *G01R 31/2851* (2013.01); *G01R 31/2894* (2013.01)

(58) Field of Classification Search
CPC .. G01R 31/08; G01R 31/303; G01R 31/2851; G01R 31/2894
See application file for complete search history.

(56) References Cited

U.S. PATENT DOCUMENTS 8,312,401 B2 * 11/2012 Leu ........................... G03F 1/84
716/112
2010/0119144 A1 * 5/2010 Kulkarni ........... H01L 21/67005
382/149

* cited by examiner

*Primary Examiner* — Minh N Tang
(74) *Attorney, Agent, or Firm* — Anova Law Group, PLLC

(57) ABSTRACT

A method for detecting static-current failure devices in a chip is provided. The method includes providing a chip and determining existence of a static-current failure device in the chip. The method also includes detecting positions of a plurality of hotspots in the chip when the existence of the static-current failure devices is determined; and selecting a common circuit path according to position information of the hotspots in a circuit layout file of the chip. Further, the method includes converting a circuit layout of the common circuit path into a corresponding electrical diagram and marking the positions of the plurality of hotspots on corresponding positions on the electrical diagram; and detecting a shared device of the hotspots in the electrical diagram. Further, the method includes marking a position of the shared device in the circuit layout as a position of a static-current failure device.

20 Claims, 3 Drawing Sheets

IN-CHIP STATIC-CURRENT DEVICE FAILURE DETECTING METHODS AND APPARATUS

CROSS-REFERENCES TO RELATED APPLICATIONS

This application claims the priority of Chinese patent application No. 201410182150.9, filed on Apr. 30, 2014, the entirety of which is incorporated herein by reference.

FIELD OF THE INVENTION

The present invention generally relates to the field of detection technology and, more particularly, relates to methods for detecting static-current device failure in a chip and detection apparatus thereof.

BACKGROUND

In the detection of product yield, static-current failure is a common failure mode for chips. With the evolvement of the technical node, the size of semiconductor device has become smaller and smaller, and the static-current has become larger and larger. For low power consumption devices, the requirement for the static-current is very strict. For example, if the static-current of the devices used in cell phone and laptops, etc., which use batteries as power sources, is significantly large, the standby time will be reduced. Thus, such products are less competitive in the markets. For the detection of a device failure caused by a large static-current, a commonly used procedure is to locate the failure position; and followed by a physical failure analysis (PFA). With the development of the semiconductor technology, the improvement of the integration level and the increase of the requirements for the static-current, it is more difficult to locate the device failure caused by the static-current.

The existing method for detecting the position of the device failure caused by the static-current is to find corresponding positions of hotspots on the circuit layout according to the positions obtained by a hotspot detection. Then, the failure spot may be found by delayering the chip to perform a PFA. However, in most cases, a plurality of similar hotspots may be found on the failure chip, but the failure spots may not be found by directly delayering the chip because the plurality of similar hotspots may not be the real position of the failure spots but the circuits affected by the failure spots. The disclosed methods and apparatus are directed to solve one or more problems set forth above and other problems.

BRIEF SUMMARY OF THE DISCLOSURE

One aspect of the present disclosure includes a method for detecting a static-current failure device in a chip. The method includes providing a to-be-tested chip and determining existence of a static-current failure device in the to-be-tested chip. The method also includes detecting positions of a plurality of hotspots in the to-be-tested chip when the existence of the static-current failure devices is determined; and selecting a common circuit path of the hotspots according to position information of the hotspots in a circuit layout file of the to-be-tested chip. Further, the method includes converting a circuit layout of the common circuit path into a corresponding electrical diagram and marking the positions of the plurality of hotspot on corresponding positions on the electrical diagram; and detecting a shared device of the hotspots in the electrical diagram. Further, the method includes marking a position of the shared device in the circuit layout as a position of the static-current failure device.

Another aspect of the present disclosure includes a detection apparatus of a static-current failure device in a chip. The detection apparatus of a static-current failure device in a chip includes a first determination unit configured to determine existence of a static-current failure device in a chip; and a first detection unit configured to detect positions of a plurality of hotspots in the chip if the existence of the static-current failure device is determined. The detection apparatus of a static-current failure device in a chip also includes a selection unit configured to select a common path of the plurality of hotspots according to position information of the hotspots in a circuit layout file; and a conversion unit configured to convert a circuit layout of the common circuit path into a corresponding electrical diagram. Further, the detection apparatus of a static-current failure device in a chip includes a first marking unit configured to mark the positions of the plurality of hotspots on corresponding positions on the electrical diagram; and a second detecting unit configured to detect a shared device of the hotspots in the electrical diagram. Further, the detection apparatus of a static-current failure device in a chip also includes a second marking unit configured to mark a position of the shared device on the circuit layout as a position of a static-current failure device.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the common reference numbers will be used throughout the drawings to refer to the common or like parts.

In a method for detecting the static-current of a chip, the positions of hotspots are found firstly; and then the corresponding positions of the hotspots in a circuit layout of the chip is found. Then, the chip is delayered to perform a physical failure analysis (PFA); and the static-current failure spots (or devices) may be found. As used herein, the hotspot is referred to a hot region caused by the existence of a large static-current. Under the most circumstances, a plurality of shared hotspots may be found in a failed chip. However, if the PFA is directly performed, it may not be able to find the failure spots. The reason may be that the positions of the shared hotspots may not be the actual failure spots but the circuits affected by the hotspots. If the common paths of the shared hotspots are checked one by one to find the failure spots in the circuit layout, because the paths may be significantly long, and it may pass through contact holes (CTs), contact vias (contacts between the first level and the second level metals) and metals, etc., all such metal layers may need to be determined by human, thus it may need significantly large amount of time; and it may be difficult to confirm the actual failure spots.

Figure 1:
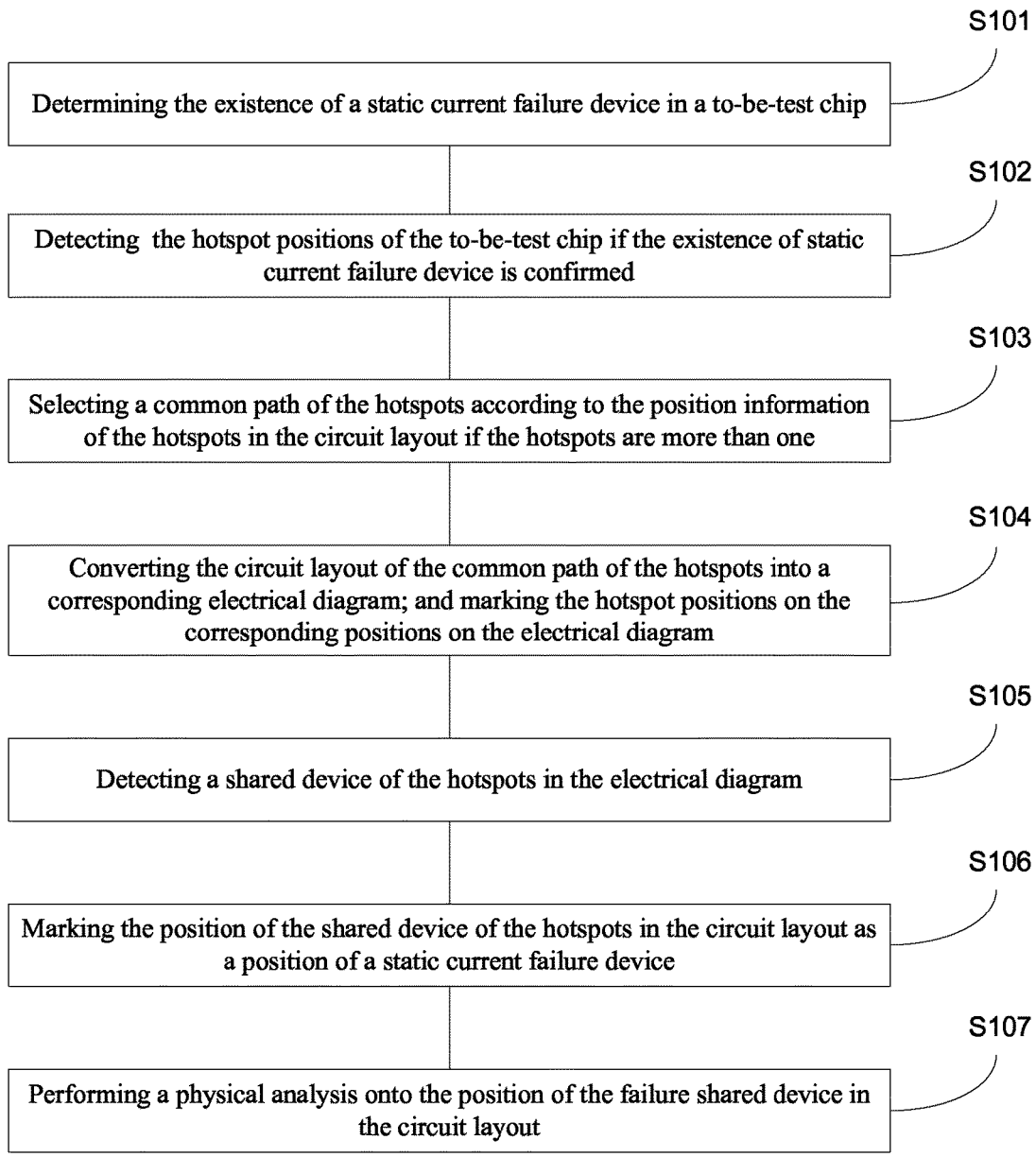
FIG. 1 illustrates an exemplary detection process of a static-current failure device in a chip consistent with the disclosed embodiments.

According to the disclosed methods and apparatus, the failure spots may be rapidly and precisely find by relating the hotspot positions with the corresponding positions of hotspots on the electrical diagram. FIG. 1 illustrates an exemplary detection process of static-current failure devices in a chip consistent with the disclosed embodiments.

As shown in FIG. 1, at the beginning of the detection process, a to-be-tested chip is provided; and the existence of static-current failure devices is determined (S101). The existence of the static-current failure devices may be determined by comparing the to-be-tested chip with a standard chip. As used herein, the standard chip refers to a chip having a performance matching the designed requirements. There may be a plurality of static-current failure devices in a chip, for illustrative purposes, one static-current failure device is used in the description.

Various parameters of the to-be-tested chip may be used to determine the existence of the static-current failure device, such as the output current, etc. In one embodiment, the output current of the to-be-tested chip and the output current of the standard chip may be obtained. Then, the value of the output current of the to-be-tested chip and the value of the output current of the standard chip may be compared; and the existence of the static-current failure devices may be obtained. For example, the I-V characteristic curves of the to-be-tested chip and the standard chip may be compared. If the I-V characteristic curve of the to-be-tested chip is significantly different from the I-V characteristic curve of the standard chip, the to-be-tested chip may have one or more failure devices.

If the current of the to-be-tested chip is greater than the current of the standard chip with a pre-determined first value, the resistance of the to-be-tested chip may be relatively small. In a practical application, the resistance may be a few ohms or below. Such a low resistance may indicate that the connection of the metal lines and or the protection layer of the back end of the line may have failures. For example, the metal interconnect lines or contacts may have short circuits.

If the current of the to-be-tested chip is smaller than the current of the standard chip with a pre-determined second value, the resistance of the to-be-tested chip may be significantly large. In a practical application, the resistance of the to-be-tested chip may be a few of tenths ohms. Such a large resistance may indicate that the fabrication of the devices of the front end of line may be problematic. For example, the field-effect transistors, the diodes, the single crystal silicon, or the poly crystal silicon, etc., may have short circuits. If one of the two above-mentioned conditions is found in the to-be-tested chip, it may confirm that there is at least one failure device generating static-current in the to-be-tested chip. That is, a static-current failure device is found.

Returning to FIG. 1, after determining the existence of the static-current failure device in the to-be-tested chip, hotspot positions in the to-be-tested chip may be detected (S102). In one embodiment, if the output current of the to-be-tested chip is greater than the output current of the standard chip with a pre-determined first value, the hotspot analysis may be performed by an optical beam induced resistance change (OBIRCH) method. The OBIRCH method may utilize a laser or other light to irradiate metal lines to change the resistance of the metal line so as to change the current in the metal line. Then, the current difference may be compared with the brightness of the image pixels of the image formed at the position irradiated by the laser. Thus, the leakage current position (the position of a hotspot) may be obtained.

In certain embodiments, if the output current of the to-be-tested chip is smaller than the output current of the standard chip with a pre-determined second value, the hotspot analysis may be performed by an emission microscope (EMMI). The EMMI may detect and locate the weak emission light generating from the devices in a chip, thus the visible light of the leakage current generated by various kinds of device defects and anomalism may be caught. Therefore, the leakage current position in the to-be-tested chip may be detected; and the leakage current position is the hotspot position.

Referring to FIG. 1, after detecting the hotspot positions and if the hotspots are more than two, a common circuit path of the hotspots may be selected according to the position of the hotspots in the circuit layout file (Step 103). In one embodiment, if there is only one hotspot, the position of hotspot may be the position of the failure spot, thus a physical failure analysis may be perform onto the hotspot position.

In certain other embodiments, if more than two hotspots are found, the shared GND pin and the shared power pin of the hotspots may be found in the circuit layout file according to the position information of the hotspots in the circuit layout file. Further, using the shared GND pin and the shared power pin as a boundary region, a common circuit path of the hotspots in the circuit layout may be selected. As used herein, using the shared GND pin and the shared power pin as a boundary region may also refer to select the power region in which all the hotspots locate.

Figure 2:
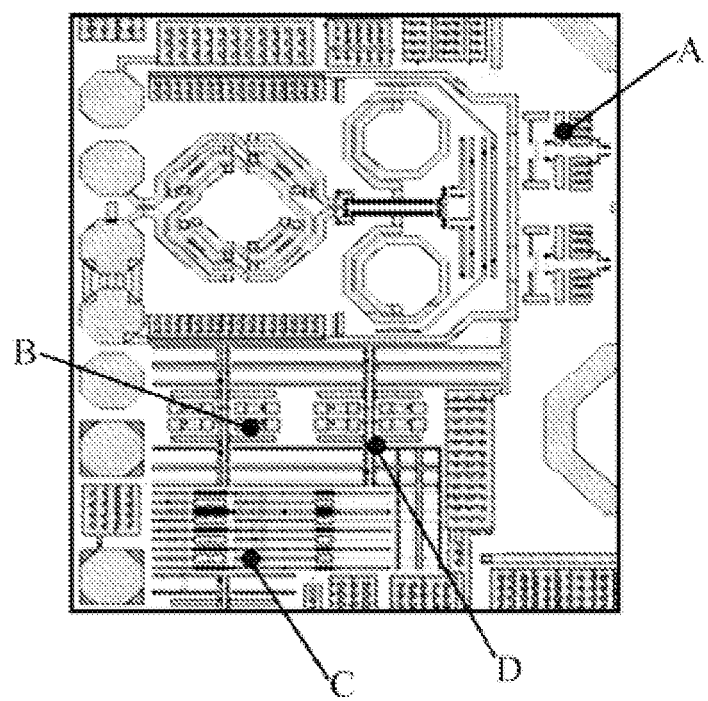
FIG. 2 illustrates an exemplary circuit layout having a plurality of hotspots consistent with the disclosed embodiments.

For example, as shown in FIG. 2, after detecting the hotspot positions as described in Step 102, four hotspot positions corresponding to the position A, the position B, the position C and the position D on the circuit layout file may be found. Then, the GND pin and the power pin shared by the position A, the position B, the position C and the position D illustrated on the circuit layout may be selected. Thus, a common circuit path of all the hotspots on the circuit layout may be obtained by using the shared GND and the shared power pin as a boundary region.

Returning to FIG. 1, after selecting the common circuit path, the circuit layout of the common circuit path may be converted into a corresponding electric diagram; and the hotspot positions may be marked on the corresponding positions on the electrical diagram (S104). In one embodiment, the circuit layout of the common circuit path of the hotspots may be converted into the corresponding electrical diagram by a layout VS schematic tool (LVS tool).

Specifically, a graphic computation process may be performed onto the original data of the common circuit path in the circuit layout according to the selected mark information of the shared GND pin and the shared power pin, thus the information of the electronic devices and interconnect relationship of the electronic devices of the common circuit path may be abstracted; and the corresponding electrical diagram may be generated. At the same time, the hotspot "A", the hotspot "B", the hotspot "C" and the hot spot "D" may be marked at the corresponding positions in the electrical diagram according to the mark information of the hotspot "A", the hotspot "B", the hotspot "C" and the hot spot "D" on the circuit layout.

Figure 3:
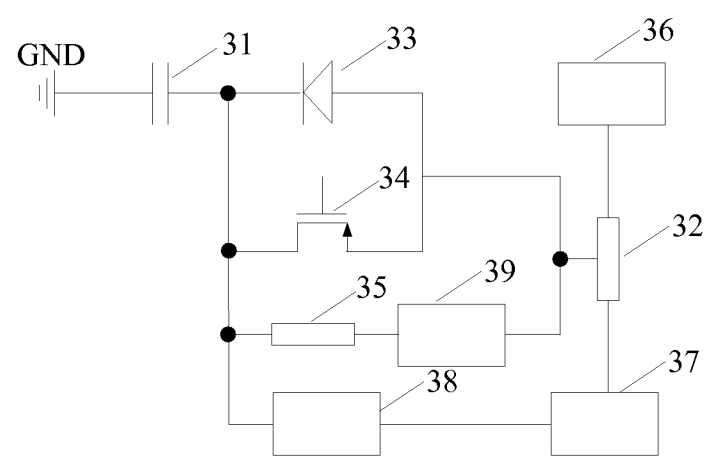
FIG. 3 illustrates an exemplary electrical diagram corresponding to the circuit layout illustrated in FIG. 2 consistent with the disclosed embodiments.

As shown in FIG. 3, the corresponding position of the hotspot "A" on the electrical diagram may be a resistor 32. The corresponding position of the hotspot "B" on the electrical diagram may be a diode 33. The corresponding position of the hotspot "C" on the electrical diagram may be a PMOS transistor 34. The corresponding position of the hotspot "D" on the electrical diagram may be a resistor 35. The circuit unit 36, the circuit unit 37, the circuit unit 38 and the circuit unit 39 may be other circuit units of the electrical diagram. The device 31 may be a grounded capacitance.

Returning to FIG. 1, after converting the circuit layout of the common circuit path into the electrical diagram; and marking the hotspots on the corresponding positions on the electrical diagram, the shared device of the hotspots in the electrical diagram may be detected (S105). Specifically, according to the information of the interconnect relationship and the specific positions of the hotspots in the electrical diagram obtained by Step S104, a common path of the hotspots in the power region of the electrical diagram may be obtained.

As shown in FIG. 3, the only common path of the resistor 32, the diode 33, the PMOS transistor 34 and the resistor 35 corresponding to the hotspots is a path from the capacitor 31 to the ground. Thus, the capacitor 31 is the only device shared by all the hotspots. In certain other embodiments, the shared device may be more than one.

In one embodiment, after finding the shared device (S105), the failure mode of the shared device may be determined according to the current and voltage testing data of the circuit shown in the electrical diagram, and the device emission principle data. By testing the electrical properties of the circuit shown in the electrical diagram, the testing data of the current and voltage may be obtained. If the testing data of the current is significantly different from the pre-set standard range, it may confirm that the shared device in the circuit is failed.

The device emission principle data may include the device type and the corresponding leakage principle. In the above-described embodiment, according to the device type of the shared device obtained by Step 105, the device emission principle data matching with the shared device may be read from the device emission principle database, thus the failure mode of the shared device may be confirmed. For example, as shown in FIG. 2 and FIG. 3, when the testing current and voltage of the circuit is greater than the standard region, the leakage principle in the device emission principle data corresponding to the shared capacitance may be read; and the failure mode of the capacitance 31 may be determined as a short circuit between the top and bottom electrode plates.

For illustrative purposes, the capacitance 31 is used as an example for the device type in the device emission principle database. In certain other embodiments, the device type in the device emission principle database may be expanded and updated according to practical applications.

Returning to FIG. 1, after determining the failure mode of the shared device, the position of the shared device in the circuit layout may be marked as the position of a static-current failure device (S106). Specifically, when the failure device is detected in the electrical diagram, the position of the shared failure device, for example, the capacitance 31 shown in FIG. 3, may be highlighted in the circuit layout file according to the conversion data of the circuit layout and the corresponding electrical diagram used in S103.

Returning to FIG. 1, after marking the failure shared device as the static-current failure device in the circuit layout, a physical failure analysis may be performed onto the position of the failure shared device in the circuit layout (S107). After finding the specific failure spot in the circuit layout according to the electrical testing, a physical failure analysis (PFA) process, such as a chip delayering process, etc., may be performed by controlling the physical testing instruments. Further, the confirmed device failure mode may be used to further instruct the physical failure analysis.

According to the above-described embodiment, the hotspot positions may be input in the electrical diagram according to the conversion between the circuit layout and the electrical diagram. Then, the position of the possible failure device may be displayed on the circuit layout according to the pre-defined device characteristic of the device causing a leakage current emission, i.e., the leakage principle. Further, the electrical diagram related to the hotspots may be output. Thus, the failure spot may be successfully found. Such a method may save the time for the problem solving; and may aid to direct the physical failure analysis process.

Figure 4:
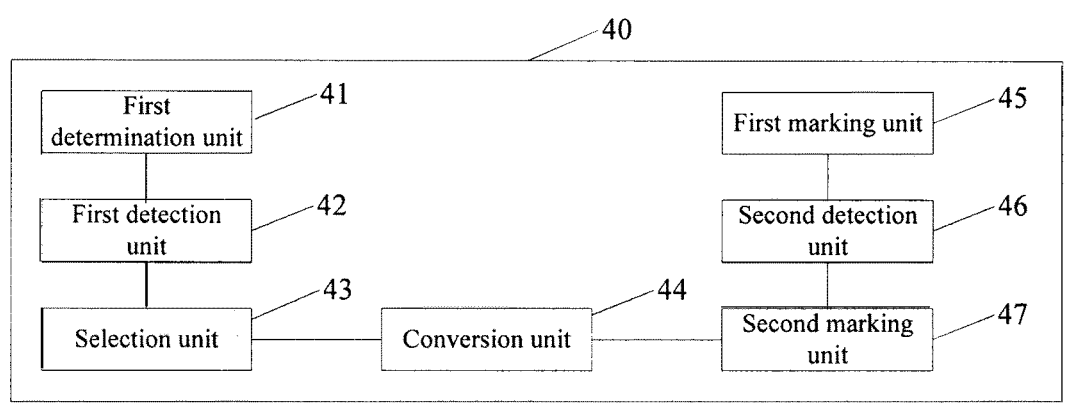
FIG. 4 illustrates an exemplary detection apparatus of static-current failure devices consistent with the disclosed embodiments.

FIG. 4 illustrates a detection apparatus for performing the disclosed detection method of a static-current failure device in a to-be-tested chip consistent with the disclosed embodiments. As shown in FIG. 4. The detection apparatus may include a first determination unit 41. The first determination unit 41 may be configured to determine if there is at one static-current failure device in the to-be-tested chip.

The detection apparatus may also include a first detection unit 42. The first detection unit 42 may be configured to detect the positions of the hotspots in the to-be-tested chip if there is at least one static-current failure device in the to-be-tested chip.

Further, the detection apparatus may include a selection unit 43. The selection unit 43 may be configured to select a common circuit path of the hotspots according to the position information of the hotspots in the circuit layout file if the hotspots are more than one.

Further, the detection apparatus may also include a conversion unit 44. The conversion unit 44 may be configured to convert the circuit layout of the shared circuit path into a corresponding electrical diagram.

Further, the detection apparatus may also include a first marking unit 45. The first marking unit 45 may be configured to mark the position of the hotspots on the corresponding positions on the electrical diagram.

Further, the detection apparatus may also include a second detection unit 46. The second detection unit 46 may be configured to detect a shared device of the hotspots in the electrical diagram.

Further, the detection apparatus may also include a second marking unit 47. The second marking unit 47 may be configured to mark the position of the shared device in the circuit layout as the position of a static-current failure device.

In one embodiment, the first determination unit 41 may include a determination sub-unit. The determination sub-unit may be configured to compare the output current value of the to-be-tested chip and the output current of the standard chip. If the output current of the to-be-tested chip is greater than a pre-determined first value; or smaller than a pre-determined second value, it may confirm that there is at least one static-current failure device in the chip.

In one embodiment, the first detection unit 42 may include a first detection sub-unit. The first detection sub-unit may be configured to detect the position of the hotspots by an optical beam induced resistance change (OBIRCH) method when the output current of the to-be-tested chip is greater than the output current of the standard chip with a first pre-set value. The light of the OBIRCH may be a laser light.

In one embodiment, the first detection unit 42 may also include a second detection sub-unit. The second detection sub-unit may be configured to detect the hotspot position of the to-be-tested chip by an emission microscope (EMMI) when the output current of the to-be-tested chip is smaller than the output current of the standard chip with a pre-determined second value.

In one embodiment, the selection unit 43 may include a first selection sub-unit. The first selection sub-unit may be configured to select the shared GND and the shared power pin of the hotspots on the circuit layout according to the position information of the hotspots on the circuit layout. The selection unit 43 may also include a second selection sub-unit. The second selection sub-unit may be configured to select a common circuit path using the shared GND and the shared power pin as a boundary region.

Further, in one embodiment, the detection apparatus 40 may also include a second determination unit (not shown). The second determination unit may be configured to determine the failure mode of the shared device according to the testing data of current and voltage of the circuit illustrated in the electrical diagram and the device emission principle data. In embodiment, the device emission principle may include the device type and the corresponding leakage principle.

Further, in one embodiment, the detection apparatus may also include a physical failure analysis unit (not shown). The physical failure analysis unit may be configured to perform a physical failure analysis onto the position of the shared device on the circuit layout.

All or a portion of the steps of the disclosed methods may be performed by a program through controlling related hardware. The program may be stored in a readable storage media. The storage media may include ROM, RAM, floppy, or CD, etc. The hardware may include a computing system.

For example, a computing system may include a processor, memory modules such as ROM, RAM, and flash memory modules, storage medium such as CD-ROM, U-disk, removable hard disk, etc., I/O devices such as keyboard and mouse, network devices for establishing connections through a communication network, and database(s) for storing certain operational and system data. Other devices may also be included.

By using the disclosed methods and apparatus, various advantageous applications may be implemented. According to the disclosed embodiments, the hotspot positions in the circuit layout may be detected if a static-current failure device is determined to exist in a chip. Then, the hotspot positions may be related to corresponding positions on the electrical diagram of the hotspots, thus the failure spots may be rapidly and precisely found. It may unnecessarily detect the failure spot by checking the paths on the circuit layout one by one. Therefore, the accuracy of the static-current failure device detection may be improved, and the detection time may be saved.

Further, according to the device type of the shared device, the device emission principle data may be matched, thus it may be able to rapidly determine the leakage principle of failure device, i.e., the failure mode. The failure mode may direct the fault analysis of a further physical failure analysis.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for detecting a static-current failure device in a chip, comprising:
   providing a to-be-tested chip;
   determining existence of a static-current failure device in the to-be-tested chip;
   detecting positions of a plurality of hotspots in the to-be-tested chip when the existence of the static-current failure devices is determined;
   selecting a common circuit path of the plurality of hotspots according to position information of the plurality of hotspots in a circuit layout file of the to-be-tested chip;
   converting a circuit layout of the common circuit path into a corresponding electrical diagram and marking the hotspot positions onto corresponding positions on the electrical diagram;
   detecting a shared device of the hotspots in the electrical diagram; and
   marking a position of the shared device in the circuit layout as a position of a static-current failure device.

2. The method for detecting a static-current failure device in a chip according to claim 1, wherein determining the existence of the static-current failure device in the to-be-tested chip further includes:
   confirming the existence of the static-current failure device when an output current of the to-be-tested chip is greater than an output current of a standard chip.

3. The method for detecting a static-current failure device in a chip according to claim 2, wherein detecting the hotspot positions further includes:
   detecting the hotspot position in the to-be-tested chip by an optical beam induced resistance change method when the output current of the to-be-tested chip is greater than the standard chip with a pre-determined first value.

4. The method for detecting a static-current failure device in a chip according to claim 3, wherein:
   a laser light is used for the optical beam induced resistance change method.

5. The method for detecting a static-current failure device in a chip according to claim 1, wherein determining the existence of the static-current failure device in the to-be-tested chip further includes:
   confirming the existence of the static-current failure device when an output current of the to-be-tested chip is smaller than an output current of a standard chip.

6. The method for detecting a static-current failure device in a chip according to claim 5, wherein detecting the hotspot positions further includes:
   detecting the hotspot position in the to-be-tested chip by an emission microscope when the output current of the to-be-tested chip is smaller than the standard chip with a pre-determined second value.

7. The method for detecting a static-current failure device in a chip according to claim 1, wherein selecting a common circuit path according to a position information of the hotspots in a circuit layout file further includes:

selecting a shared GND pin and a shared power pin of the hotspots in the circuit layout according the to the position information of the hotspots in the circuit layout; and selecting the common circuit path of the hotspots in the circuit layout by using the shared GND and the shared power pin as a boundary region.

8. The method for detecting a static-current failure device in a chip according to claim 1, after detecting the shared device of the hotspots in the electrical diagram, further including:

determining a failure mode of the shared device according a testing data of current and voltage of a circuit illustrated in the electrical diagram and a device emission principle data.

9. The method for detecting a static-current failure device in a chip according to claim 1, wherein:

the device emission principle data includes a device type and a leakage principle data.

10. The method for detecting a static-current failure device in a chip according to claim 1, after marking a position of the shared device in the circuit layout, further including:

performing a physical failure analysis onto the position of the shared device in the circuit layout.

11. The method for detecting a static-current failure device in a chip according to claim 10, wherein:

the physical failure analysis includes a delayering process.

12. A detection apparatus of a static-current failure device in a chip, comprising:

a first determination unit configured to determine existence of a static-current failure device in a to-be-tested chip;

a first detection unit configured to detect positions of a plurality of hotspots in the to-be-tested chip if the existence of the static-current failure device is determined;

a selection unit configured to select a common path of the plurality of hotspots according to position information of the hotspots in a circuit layout file a conversion unit configured to convert a circuit layout of the common circuit path into a corresponding electrical diagram;

a first marking unit configured to mark the hotspot positions onto corresponding positions on the electrical diagram;

a second detecting unit configured to detect a shared device of the hotspots in the electrical diagram; and a second marking unit configured to mark a position of the shared device on the circuit layout as the position of a static-current failure device.

13. The detection apparatus of a static-current failure device in a chip according to claim 12, wherein the first determination unit further includes:

a first determination sub-unit configured to determine the existence of a static-current failure device when an output current of the to-be-tested chip is greater than an output current of a standard chip with a pre-determined first value.

14. The detection apparatus of a static-current failure device in a chip according to claim 12, wherein the first determination unit further includes:

a first determination sub-unit configured to determine the existence of the static-current failure device when an output current of the to-be-tested chip is smaller than an output current of a standard chip with a pre-determined second value.

15. The detection apparatus of a static-current failure device in a chip according to claim 13, wherein the first detection unit further includes:

a first detection sub-unit configured to detect the positions of the hotspot in the to-be-tested chip by an optical beam induced resistance change method when an output current of the to-be-tested chip is greater than an output current of a standard chip with a pre-determined first value.

16. The detection apparatus of a static-current failure device in a chip according to claim 14, wherein the first detection unit further includes:

a second detection sub-unit configured to detect the positions of the hotspots in the to-be-tested chip by an emission microscope when an output current of the to-be-tested chip is smaller than an output current of a standard chip with a pre-determined second value.

17. The detection apparatus of a static-current failure device in a chip according to claim 12, wherein the selection unit further includes:

a first selection sub-unit configured to the select a shared GND pin and a shared power pin according to a position information of the hotspots in the circuit layout file; and a second selection sub-unit configured to select a common circuit path of the hotspots in the circuit layout using the shared GND pin and the shared power pin as a boundary region.

18. The detection apparatus of a static-current failure device in a chip according to claim 12, further including:

a second determination unit configured to determine a failure mode of the shared device according to a testing data of a circuit illustrated in the circuit layout and a device emission principle data.

19. The detection apparatus of a static-current failure device in a chip according to claim 18, wherein the device emission principle data further includes:

a device type; and a leakage current principle data corresponding to the data type.

20. The detection apparatus of a static-current failure device in a chip according to claim 12, further including:

a physical failure analysis unit configured to perform a physical failure analysis onto a position of the shared device in the circuit layout.

\* \* \* \* \*